(12) United States Patent
Kim et al.

(10) Patent No.: US 8,274,211 B2
(45) Date of Patent: Sep. 25, 2012

(54) WHITE ORGANIC LIGHT EMITTING DEVICE

(75) Inventors: Mu-gyeom Kim, Yongin-si (KR); Sang-yeol Kim, Yongin-si (KR); Sung-hun Lee, Yongin-si (KR); Jung-bae Song, Yongin-si (KR)

(73) Assignees: Samsung Electronics Co., Ltd., Yeongtong-gu, Suwon-si, Gyeonggi-do (KR); Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 531 days.

(21) Appl. No.: 12/078,567

(22) Filed: Apr. 1, 2008

(65) Prior Publication Data
US 2009/0115319 A1    May 7, 2009

(30) Foreign Application Priority Data
Nov. 7, 2007    (KR) .................. 10-2007-0113189

(51) Int. Cl.
*H01L 27/28* (2006.01)
*H01L 27/32* (2006.01)

(52) U.S. Cl. .................. 313/504; 313/498; 313/512

(58) Field of Classification Search .......... 313/498–512; 257/40
See application file for complete search history.

(56) References Cited

U.S. PATENT DOCUMENTS
6,747,618 B2 *  6/2004  Arnold et al. .................. 345/77
2001/0033135 A1 * 10/2001 Duggal et al. ................ 313/506
2004/0222737 A1 * 11/2004 Raychaudhuri et al. ...... 313/504

FOREIGN PATENT DOCUMENTS
WO    WO 2005115059 A1 * 12/2005
* cited by examiner

*Primary Examiner* — Anh Mai
*Assistant Examiner* — Nathaniel Lee
(74) *Attorney, Agent, or Firm* — Robert E. Bushnell, Esq.

(57) ABSTRACT

Provided is a white organic light emitting device (OLED). The white OLED includes a double cavity structure in which a first region and a second region are defined based on a transparent common electrode using a top emission method. A green phosphorescence or fluorescence emission layer is disposed in the first region, a blue fluorescence emission layer is disposed in the second region, a red emission layer is optionally disposed in the first region or the second region, and an optical path control layer (OPCL) for widening color gamut is disposed in a region in which green light and blue light are emitted so that color coordinates are not greatly changed due to a change in thickness of the OPCL and white light having good quality is obtained.

10 Claims, 6 Drawing Sheets

WHITE ORGANIC LIGHT EMITTING DEVICE

CLAIM OF PRIORITY

This application makes reference to, incorporates the same herein, and claims all benefits accruing under 35 U.S.C. §119 from an application for WHITE ORGANIC LIGHT EMITTING DEVICE earlier filed in the Korean Intellectual Property Office on 7 Nov. 2007 and there duly assigned Serial No. 10-2007-0113189.

BACKGROUND OF THE INVENTION

1. Field of the Invention

The present invention relates to a white organic light emitting device.

2. Description of the Related Art

Generally, organic light emitting devices (OLEDs) which are spontaneous emission devices that emit light by recombination of electrons and holes in an organic layer, have the advantages of high color reproducibility, fast response speed, small thickness, high contrast ratio, wide viewing angle and low power consumption. OLEDS may be used in various fields such as display devices and illumination devices.

A white OLED, which is a thin light source, is advantageous to high resolution and large scale using an open mask instead of a high definition mask, and may be used in a backlight of a liquid crystal display (LCD) or a full color display device employing a color filter. In order to increase luminous efficiency of the white OLED, many stack type structures in which several unit OLEDs are connected in series in a vertical direction have been researched.

The main objective of the white OLED is to realize white light having color coordinates (0.31, 0.31). A top emission type white OLED has a structure in which a reflective layer is disposed under a emission structure having a thickness of about 100-200 nm and white light is emitted to an upper portion of the emission structure. An optical path control layer (OPCL) for effectively extracting internal light is disposed above the emission structure in which white light is emitted. As the thickness of the OPCL increases, separation of peaks of red (R), green (G) and blue (B) light is improved and the color gamut is improved, or the peaks of R, G and B light are separated and intensities of the peaks are changed so that color coordinates are changed.

SUMMARY OF THE INVENTION

Examplary embodiments are directed to a white organic light emitting device (OLED) which substantially maintains color coordinates irrespective of change in thickness of an optical path control layer (OPCL).

According to an exemplary embodiment of the present invention, there is provided a white organic light emitting device comprising: a transparent first electrode and a reflective second electrode; a common electrode disposed between the first electrode and the second electrode and defining a first region at the first electrode and a second region at the second electrode; a green emission portion disposed in the first region; and a blue emission portion disposed in the second region.

The device may further comprise an OPCL (optical path control layer) controlling a path of light passing the first electrode and emitted to the outside.

The green emission portion may comprise an organic phosphorescence or fluorescence emission layer, and the blue emission portion may comprise an organic fluorescence emission layer. The red emission layer may be disposed in the first region or the second region, and the red emission layer disposed in the first region may be formed of a fluorescence or phosphorescence material, and the red emission portion disposed in the blue emission portion may comprise a fluorescence emission layer.

The blue emission portion and the green emission portion may further comprise at least one of a hole injection layer (HIL), a hole transport layer (HTL), an electron injection layer (EIL), an electron transport layer (ETL), a hole suppression layer and an electron suppression layer.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE INVENTION

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while the example embodiments can be modified in various ways, these embodiments are shown by way of example in the drawings and will herein be described in detail. It should be understood, however, that there is no intent to limit example embodiments to the particular forms disclosed. On the contrary, the example embodiments are intended to cover all modifications, equivalents, and alternatives falling within the scope of the example embodiments. Like numerals refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the invention. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no other elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to limit the scope of the invention. As used herein, the singular forms "a", "an" and "the" are intended to include the plural forms as well, unless the context clearly indicates otherwise. It will be further understood that the terms "comprises", "comprising, ", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures.

Figure 1:
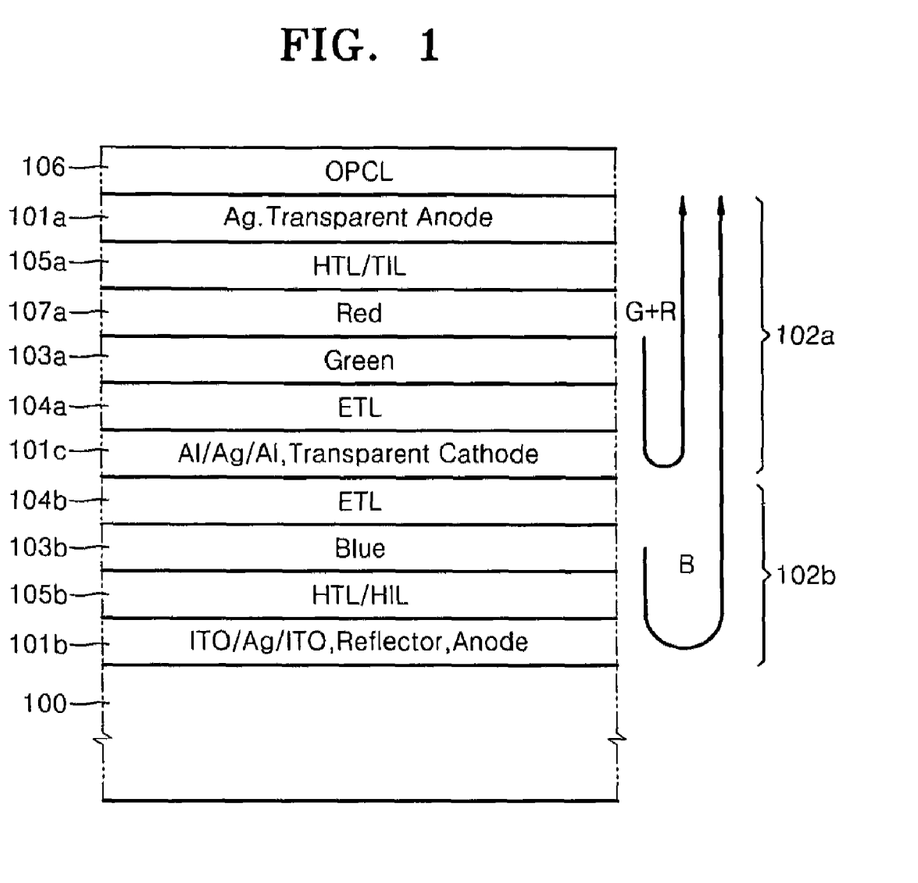
FIG. 1 is a schematic cross-sectional view of a white organic light emitting device (OLED) according to an embodiment of the present invention.

FIG. 1 is a schematic cross-sectional view of a white organic light emitting device (OLED) according to an embodiment of the present invention. Referring to FIG. 1, in the white OLED according to the current embodiment of the present invention, a common electrode 101c is disposed between a transparent first electrode 101a and a reflective second electrode 101b, and a first region or cavity 102a is formed between the transparent first electrode 101a and the common electrode 101c, and a second region or cavity 102b is formed between the reflective second electrode 101b and the common electrode 101c, thereby forming a double cavity.

A green emission portion 103a may be disposed in the first region or cavity 102a and a blue emission portion 103b may be disposed in the second region or cavity 102b. The green emission portion 103a and the blue emission portion 103b may share the common electrode 101c, and the green emission portion 103a and the blue emission portion 103b may have functional layers which are arranged symmetrical with respect to the common electrode 101c. Examples of the functional layers include a hole transport layer (HTL), a hole injection layer (HIL) and an electron transport layer (ETL). When the common electrode 101c is used as a cathode, first and second ETLs 104a and 104b may be disposed on both sides of the common electrode 101c, and first and second HTL/HILs 105a and 105b may be disposed at the transparent first electrode 101a and the reflective second electrode 101b of each of the green emission portion 103a and the blue emission portion 103b. As in a well known structure, an electron injection layer (EIL) (not shown) may be further provided to be adjacent to first and second ETLs 104a and 104b. In the present embodiment, a HTL, a HIL and an ETL which exist as a separate stack, have been described as one stack for explanatory purposes.

The reflective second electrode 101b may be formed on a substrate 100. Thus, blue light B which is generated in the blue emission portion 103b and is transmitted toward the reflective second electrode 101b, may be reflected by the reflective second electrode 101b and may be transmitted toward the first region 102a. Green light G which is generated in the first region 102a and is transmitted toward the common electrode 101c, may be reflected by the common electrode 101c, may be transmitted through the transparent first electrode 101a together with the blue light B emitted from the second region or cavity 102b and may be emitted to the outside. According to an embodiment of the present invention, transmissivity of the transparent first electrode 101a and common electrode 101c may be 70% or higher.

An optical path control layer (OPCL) 106 for controlling an optical path may be disposed on the outer surface of the transparent first electrode 101a. Thus, light which is transmitted through the transparent first electrode 101a may be transmitted through the OPCL 106 and be emitted to the outside. The OPCL 106 may have a thickness of 2-500 nm, and preferably, 450-500 nm. The OPCL 106 may be formed of an organic or inorganic dielectric material having a refractive index of 1.7-2.2 and transmissivity of 90% or higher.

A red emission portion 107a may be disposed in the first region 102a. The red emission portion 107a may contact the green emission portion 103a. Thus, the first HTL/HIL 105a and the first ETL 104a may be disposed together with the emission portion 103a in the first region 102a.

In the above embodiment, the red emission portion 107a is disposed in the first region 102a. However, referring to FIG. 2, which is a schematic cross-sectional view of a white OLED according to another embodiment of the present invention, a red emission portion 107b may be disposed in a second region or cavity 102b.

Figure 2:
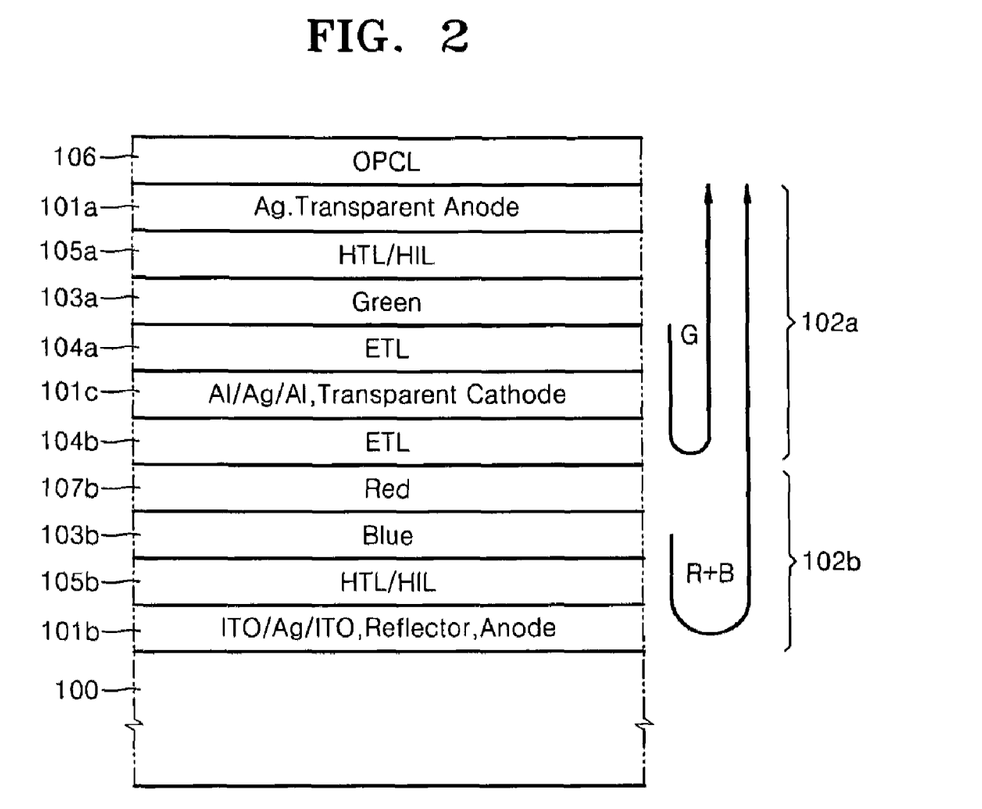
FIG. 2 is a schematic cross-sectional view of a white OLED according to another embodiment of the present invention.

In the two embodiments of FIGS. 1 and 2, the common electrode 101c may be used as an anode or cathode. In this case, a first electrode and a second electrode having the same polarity may be used as the anode or cathode. Due to such polarity change, locations of the first and second ETL 104a and 104b and the first and second HTL/HIL 105a and 105b disposed at both sides of the green emission portion 103a and the blue emission portion 103b, respectively, must be changed according to the direction of current flow. On the other hand, the white OLED may further comprise a hole suppression layer (not shown) or an electron suppression layer (not shown) which prevents holes or electrons transported to each emission portion from being dispersed to the outside.

In addition, in the two embodiments of FIGS. 1 and 2, the green emission portion 103a disposed in the first region or cavity 102a may include an organic fluorescence or phosphorescence material layer and the blue emission portion 103b disposed in the second region or cavity 102b may include an organic fluorescence material layer. In the embodiment of FIG. 1, the red emission portion 107a disposed in the first region or cavity 102a may include an organic fluorescence or phosphorescence material layer, and in the embodiment of FIG. 2, the red emission portion 107b disposed in the second region or cavity 102b may include an organic fluorescence material layer.

The thicknesses of the emission portions 103a, 103b, 107a, and 107b, the HTL/HIL 105a and 105b, the ETL 104a and 104b and the EIL (not shown) may be equal to or smaller than 30 nm.

In the above embodiments of FIGS. 1 and 2, the green emission portion 103a and the blue emission portion 103b may be disposed in the first region or cavity 102a and the second region or cavity 102b, which are different cavities, i.e., different regions. As the thickness of the OPCL 106 is increased, color separation of red (R), green (G) and blue (B) is improved. At this time, since the green emission portion 103a and the blue emission portion 103b are separated from each other, a change in color coordinates does not occur due to an increase in the peak of green light compared to blue light. In other words, when the green emission portion 103a and the blue emission portion 103b are disposed in the same region or the blue emission portion 103b is positioned in a region through which green light is transmitted, the peak of green light is larger than that of blue light. When, in this state, the thickness of the OPCL 106 is increased so as to improve color reproducibility, color reproducibility is improved but a change in color coordinates occurs due to a difference in peaks of blue light and green light. In order to use a thick OPCL so as to improve color reproducibility and to maintain a change in color coordinates, the electrical characteristic of each of the emission portions 103a, 103b, 107a, and 107b needs to be adjusted.

According to an embodiment of the present invention, even when the thickness of the OPCL 106 is increased so as to improve color reproducibility, a change in color coordinates is small and the electrical characteristic of each of the emission portions 103a, 103b, 107a, and 107b does not need to be separately adjusted.

Figure 3A:
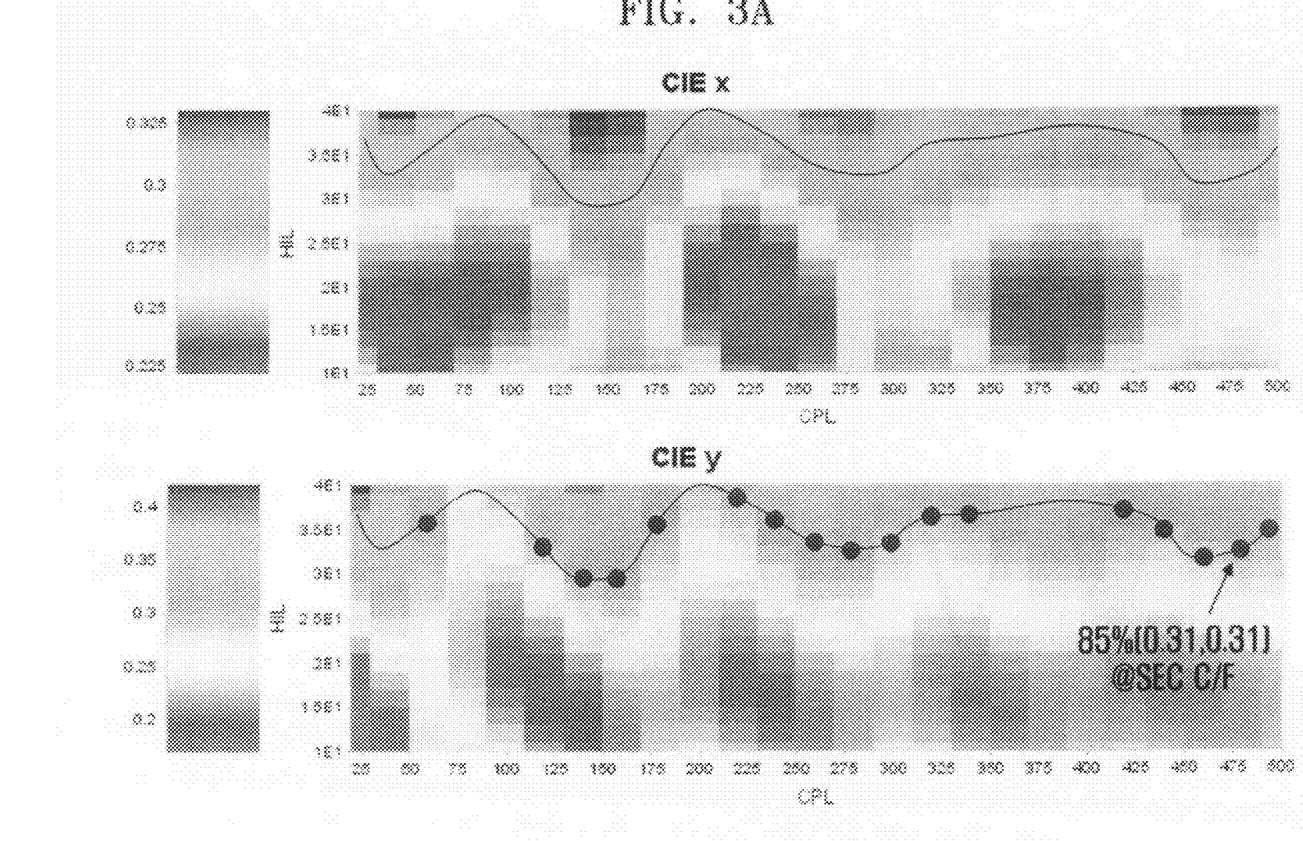
FIG. 3A is a photographic image showing a change in color coordinates CIEx and CIEy due to a change in thicknesses of a hole injection layer (HIL) and an optical path control layer (OPCL) in a white OLED according to an embodiment of the present invention.
Figure 3B:
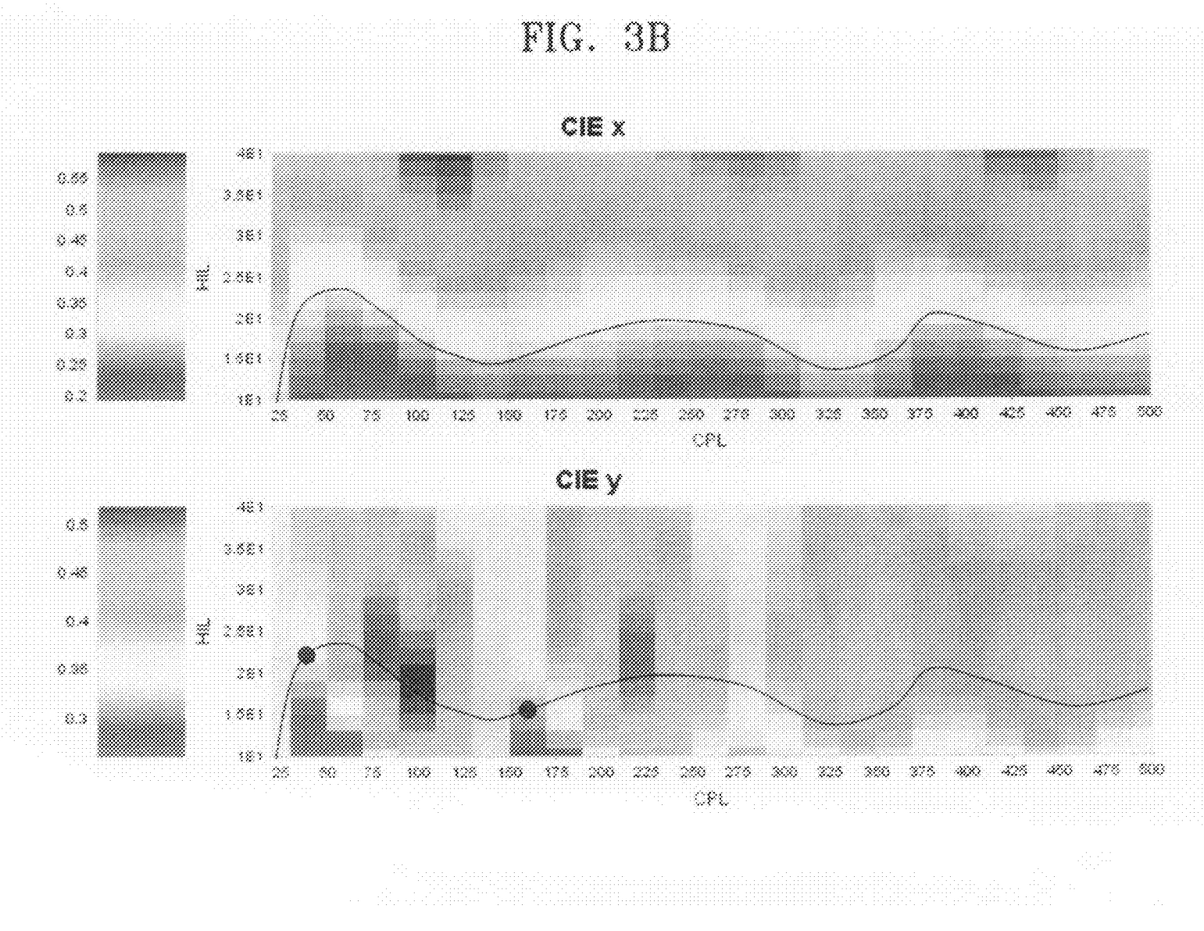
FIG. 3B is a photographic image showing a change in color coordinates CIEx and CIEy due to a change in thicknesses of a HIL and an OPCL in a conventional white OLED having a single cavity structure.
Figure 3C:
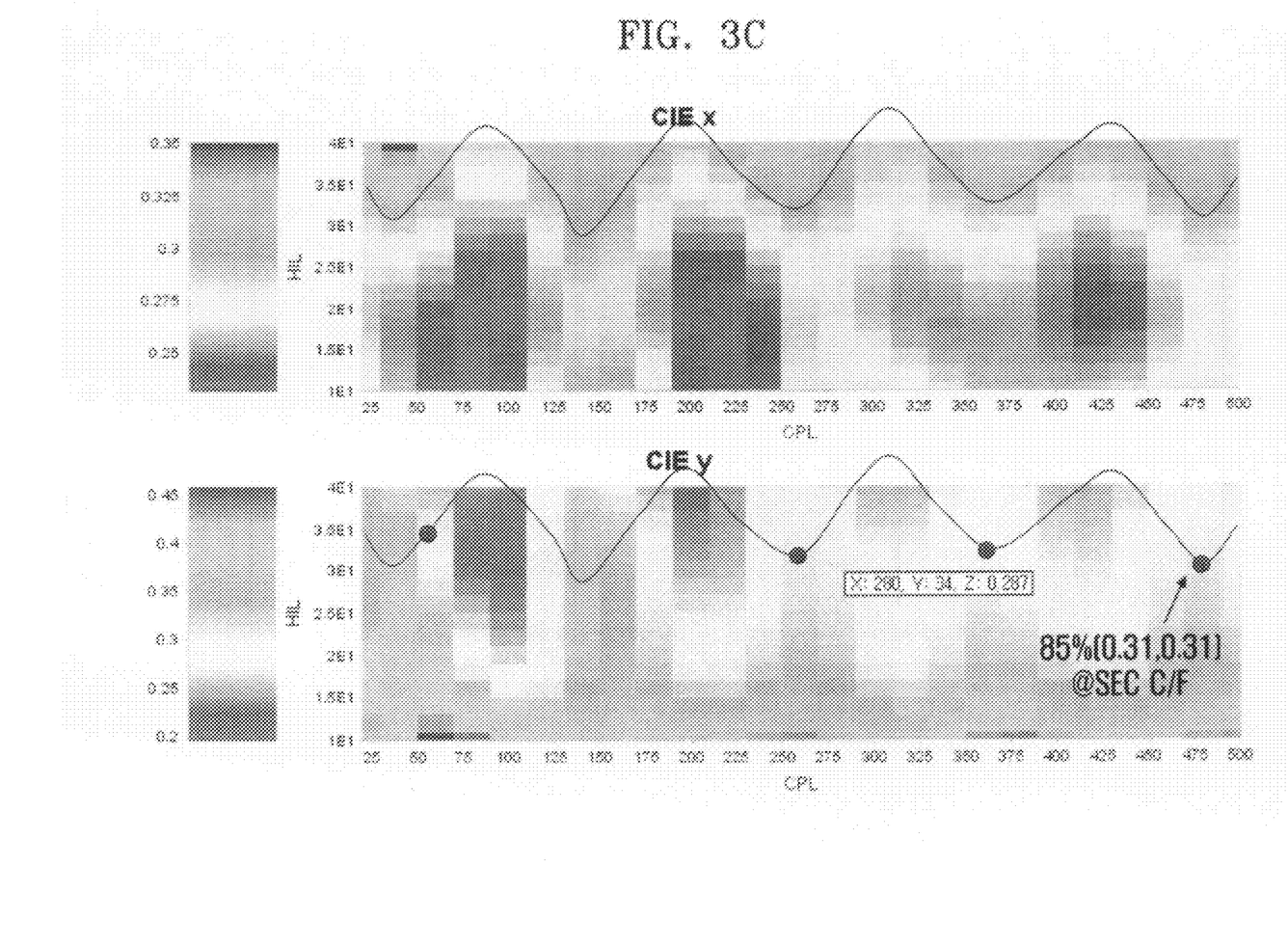
FIG. 3C is a photographic image showing a change in color coordinates CIEx and CIEy due to a change in thicknesses of a HIL and an OPCL in a comparative sample OLED having a double cavity structure in which a blue emission portion is disposed in a first region through which light emitted from a second region is transmitted.

FIG. 3A is a photographic image showing a change in color coordinates CIEx and CIEy according to the thickness (Y-axis) of a hole injection layer (HIL) corresponding to a blue emission portion and the thickness (X-axis) of an optical path control layer (OPCL) in a white OLED according to an exemplary embodiment of the present invention. FIG. 3B is a photographic image showing a change in color coordinates CIEx and CIEy of a light emitting device having a conventional structure in which a cavity is not classified, and FIG. 3C is a photographic image showing a change in color coordinates in a comparative sample OLED which has two cavities, that is, a first region and a second region, and in which a blue emission portion is disposed in the first region and red and green emission portions are disposed in the second region. In FIGS. 3A through 3C, a left spectrum column is a legend in which values of CIEx and CIEy are represented as chromaticity and CPL in the x-axis represents the thickness of an OPCL. When the thickness of the OPCL varied between 25 and 500 nm, the thickness of the HIL may be adjusted so that CIEx is 0.31 at a thickness of 30-40 nm. The thickness of the HIL in which CIEx and CIEy are both 0.31 is represented as a line according to the thickness of an OPCL. As illustrated in FIG. 3A, when the blue emission portion is disposed in the second region and the green and red emission portions are disposed in the first region, when CIEx and CIEy are both 0.31, a change in thickness of the OPCL and a change in the thickness of the HIL occur in nearly the same patterns. Points on a change curve in the spectrum of CIEy of each drawing represent the thickness at which color coordinates are adjusted to (0.31, 0.31). Thus, it can be ascertained that white light is being generated regardless of the thickness of the OPCL. However, in the case of a comparative sample OLED which has a conventional single or double cavity structure and in which a blue emission portion is disposed in a first region, as the thickness of the OPCL increases, a change in color coordinates occurs and portions of correct color coordinates are not much. The stack structure and thickness of the comparative sample OLED used in color coordinates measurement of FIG. 3A are shown in Table 1.

TABLE 1

| Stack | Material | Thickness (nm) |
| --- | --- | --- |
|  | Air | 0 |
| OPCL | dielectric | 40 |
| First electrode | Ag | 7 |
| First HIL/HTL | HIL | 22 |
|  | HTL | 11 |
| Red emission portion | Red EML | 8 |
| Green emission portion | Green EML | 12 |
| First ETL | ETL | 30 |
|  | LiF | 0.6 |
| Common electrode | Al | 2 |
|  | Ag | 7 |
|  | Al | 2 |
|  | LiF | 0.6 |
|  | ETL | 30 |
| Blue emission portion | Blue EML | 12 |
| Second HIL/HTL | HTL | 11 |
|  | HIL | 22 |
| Second electrode | ITO | 7 |
|  | Ag | 100 |
|  | ITO | 7 |

Figure 4:
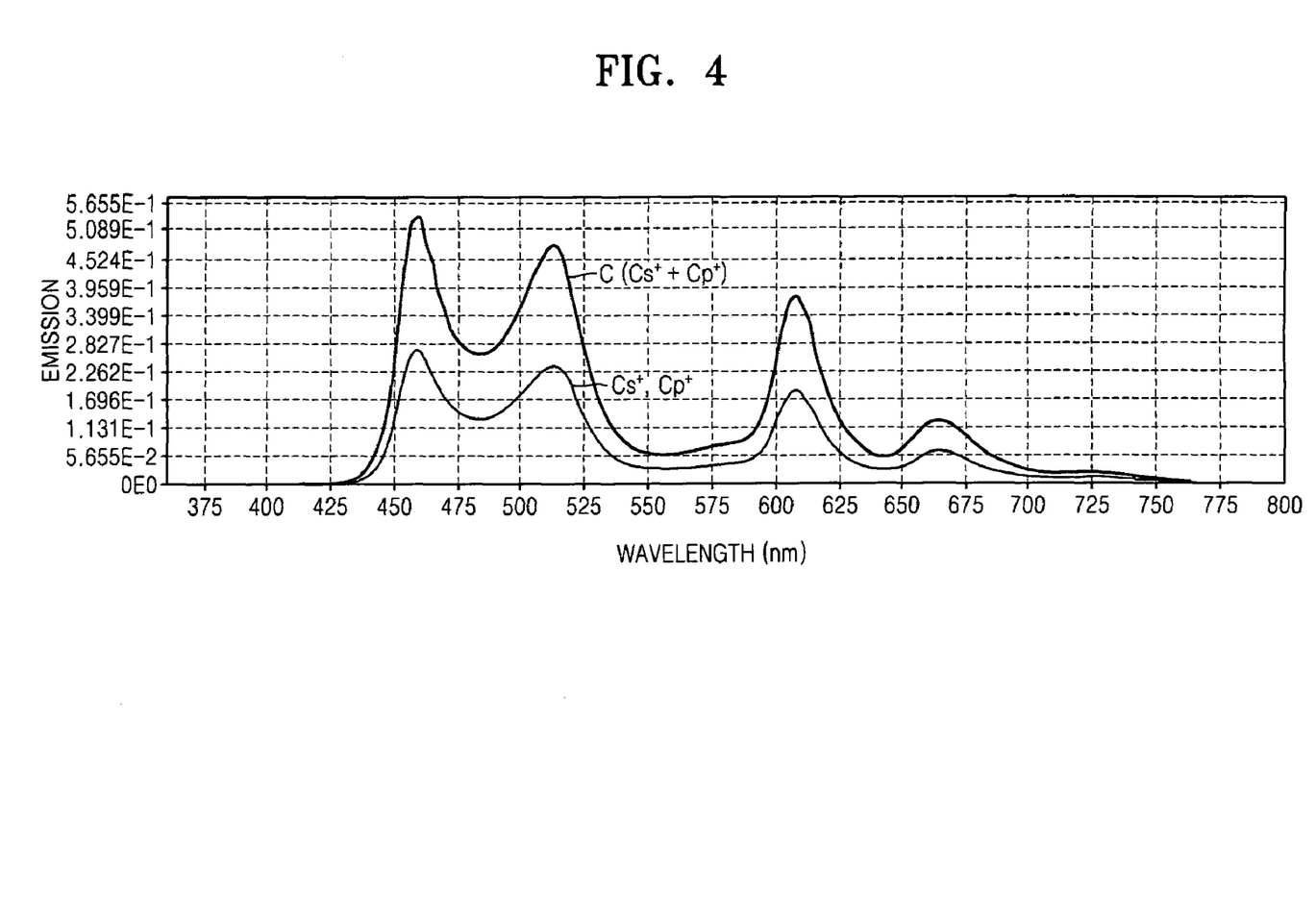
FIG. 4 is a spectrum graph showing color separation according to an embodiment of the present invention.

FIG. 4 is a spectrum graph showing color separation according to an embodiment of the present invention. In FIG. 4, Cs+ is s-polarization of photons and Cp+ is p-polarization. Since an isotropic property has been assumed on simulation, Cs+ is equal to Cp+ (Cs+=Cp+), and C is the sum of Cs+ and Cp+ (C='Cs+'+'Cp+'). An actually-measured spectrum is C.

As illustrated in FIG. 4, when a thick OPCL is used, peaks of R, G and B spectrums are well separated. Such good color separation means that a good color gamut is achieved. CIEx and CIEy of color coordinates are maintained regardless of the thickness of the OPCL because, as the thickness of the OPCL increases, B and G peaks are separated, and the intensity of G increases, which results in an increase in CIEy, and a double cavity is used so that an increase in G peaks is suppressed.

In a conventional top emission white OLED structure, an optical color change due to thickness of the OPCL may be large. In order to represent full color impression color gamut must be increased. An increase in thickness of the OPCL used for optical adjustment may cause an adverse effect such an increase in color gamut or CIEy. According to the present invention, a double cavity may be used by dividing B and G/R so that CIE coordinates (CIEx, CIEy) of a emission portion that increases color gamut and is electrically optimized are not changed.

In the above-described embodiments, conventionally-used materials maybe used for each stack, and descriptions thereof are schematically provided below.

Examples of transparent materials used for the transparent first electrode 101a and the reflective second electrode 101b include indium tin oxide (ITO), indium zinc oxide (IZO), tin oxide ($SnO_2$) and zinc oxide (ZnO). The reflective second electrode 101b may be formed of a thin layer having a thickness of 10 nm or less. Examples of reflective materials used for the second electrode includes lithium (Li), magnesium (Mg), aluminum (Al), aluminum-lithium (Al—Li), calcium (Ca), magnesium-indium (Mg—In), magnesium-silver (Mg—Ag) etc.

Well known materials, for example, a phthalocyanine compound such as copper phthalocyanine, TCTA, m-MTDATA, m-MTDAPB and $MoO_3$ which are Starburst type amine derivative, Pani/DBSA(Polyaniline/Dodecylbenzene-sulfonic acid) or PEDOT/PSS(Poly(3,4-ethylenedioxythiophene)/Poly(4-styrenesulfonate), Pani/CSA(Polyaniline/Camphor sulfonicacid) or PANI/PSS(Polyaniline)/

Poly(4-styrenesulfonate) which is a conductive polymer having solubility may be used as a material used for the HIL 105a.

The thickness of the HIL 105a maybe about 100-10000 Å, preferably, 100-1000 Å. If the thickness of the HIL 105a is less than 100 Å, the characteristic of the HIL 105a may be deteriorated, and if the thickness of the HIL 105a is greater than 10000 Å, a driving voltage may be increased.

Well known materials, for example, carbazole derivative such as N-phenylcarbazole or polyvinylcarbazole and conventional amine derivative having an aromatic condensed ring such as N,N'-bis(3-methylphenyl)-N,N'-diphenyl-[1,1-biphenyl]-4,4'-diamine(TPD), N,N'-di(naphthalene-1-yl)-N, N'-diphenyl benzidine($\alpha$-NPD) may be used as a material used for the HTL 105a.

The thickness of the HTL 105a may be about 50-1000 Å, preferably, 100-600 Å. If the thickness of the HTL 105a is less than 50 Å, the characteristic of the HTL 105a may be deteriorated, and if the thickness of the HTL 105a is greater than 1000 Å, a driving voltage may be increased.

A material used to stably transport electrons injected from a cathode may be used for ETL 104a and 104b. Well known materials, for example, an oxazole-based compound, an isoxazole-based compound, a triazole-based compound, an isothiazole-based compound, an oxadiazole-based compound, a thiadiazole-based compound, a perylene-based compound, an aluminum complex (i.e., Alq3(tris(8-quinolinolato)-aluminium) BAlq, SAlq, Almq3 or a gallium complex (i.e., Gaq'2OPiv, Gaq'2OAc, 2(Gaq'2)) may be used as the material used for the ETL 104 and 104b.

The material used for an EIL (not shown) is not limited, and a material used to easily facilitate injection of electrons from a cathode electrode may be used for the EIL. Well known materials, for example, LiF, NaCl, CsF, $Li_2O$, BaO, $BaF_2$ and a mixture of $CsCO_3$ and BCP may be used to form the EIL. Conditions for depositing the EIL may be different according to compounds but may be nearly the same as conditions for forming the HIL.

Phosphorescence dopant used for a green emission portion is not limited.

[Coumarin 6], Ir(PPy)3(PPy=2-phenylpyridine) may be used as green dopant, and [4-(dicyanomethylene)-2-t-butyl-6-(1,1,7,7-tetramethyljulolidyl-9-enyl)-4H-pyran (4-(dicyanomethylene)-2-t-butyl-6-(1,1,7,7-tetramethyljulolidyl-9-enyl)-4H-pyran;DCJTB)], PtOEP, RD 61 and RD 15 made by UDC corportion, or TER021 made by Merck corporation may be used as red dopant.

Blue dopant used for a blue emission portion is not limited. DPAVBi, DPAVBi derivative, distyrylarylene (DSA), distyrylarylene derivative, distyrylbenzene (DSB), distyrylbenzene derivative, spiro-DPVBi spiro-6P(spiro-sexyphenyl), or the like may be used as blue dopant. Red dopant used for a red emission portion is not limited. 4-(dicyanomethylene)-2-t-butyl-6-(1,1,7,7-tetramethyljulolidyl-9-enyl)-4H-pyran;DCJTB), PtOEP and RD 61 made by UDC corporation may be used as red dopant. Green dopant used for a green emission portion is not limited. Coumarin, Ir(PPy)3(PPy=2-phenylpyridine) or the like may be used as green dopant.

A red phosphorescence material may be one material selected from the following materials: Tris(dibenzoylmethane)phenanthroline europium(III), Bis(2-benzo[b]thiophen-2-yl-pyridine)(acetylacetonate)iridium (III), Tris(1-phenylsoquinoline)iridium (III), Bis(1-phenlisoquinoline)(acetylacetonate) iridium(III), Bis([1-(9,9)-dimethyl-9H-fluoren-2-yl]-isoquinoline) (acetylacetonate)iridium(III), Bis[3-(9,9-dimethyl-9H-fluoren-2-yl)-isoquinoline](acetylacetonate)iridium(III),Tris[4,4'-di-tert-butyl-(2,2')-bipyridine]ruthenium(III) complex, and Tris(2-phenylquinoline)iridium(III).

A red fluorescence material may be one material selected from the following materials:4-(Dicyanomethylene)-2-tert-butyl-6-(1,1,7,7-tetramethyljulolidin-4-yl-vinyl)-4H-pyran, Tetraphenylnaphthancene, and Bis(2-phenylquinoline)(acetylacetonate)iridium (III).

It will be obvious that the embodiments described above may be varied in many ways. Such variations are not to be regarded as a departure from the intended spirit and scope of the present invention, and all such modifications as would be obvious to one skilled in the art are intended to be included within the scope of the following claims.

What is claimed is:

1. A white organic light emitting device comprising:
a transparent first electrode and a reflective second electrode;
a common electrode disposed between the transparent first electrode and the reflective second electrode and defining a first region corresponding to the transparent first electrode and a second region corresponding to the reflective second electrode;
a red emission portion;
a green emission portion disposed only in the first region; and
a blue emission portion disposed only in the second region,
wherein said first region is disposed on and in direct contact with said second region,
wherein said red emission portion is disposed only in said second region, on and in direct contact with said blue emission portion.

2. The device of claim 1, wherein the green emission portion comprises an organic phosphorescence or fluorescence emission layer, and the blue emission portion comprises an organic fluorescence emission layer.

3. The device of claim 2, wherein the red emission portion comprising an organic phosphorescence or organic fluorescence emission layer.

4. The device of claim 2, wherein the red emission portion comprising an organic fluorescence emission layer in the second region.

5. The device of claim 1, wherein the first electrode and the common electrode have transmissivity of 70 % or higher.

6. A white organic light emitting device comprising:
a transparent first electrode and a reflective second electrode;
a common electrode disposed between the transparent first electrode and the reflective second electrode and defining a first region corresponding to the transparent first electrode and a second region corresponding to the reflective second electrode;
a green emission portion disposed only in the first region;
a blue emission portion disposed only in the second region; and
an optical path control layer (OPCL) controlling a path of light transmitted through the first electrode and emitted to the outside, said OPCL having a uniform thickness and flat surfaces,
wherein a red emission portion is disposed only in said second region, on and in direct contact with said blue emission portion.

7. The device of claim 6, wherein the green emission portion comprises an organic phosphorescence or fluorescence emission layer, and the blue emission portion comprises an organic fluorescence emission layer.

8. The device of claim 7, wherein the red emission portion comprising an organic phosphorescence or organic fluorescence emission layer.

9. The device of claim 7, wherein the red emission portion comprising an organic fluorescence emission layer in the second region.

10. The device of claim 6, wherein the OPCL has a thickness of 450-500 nm.

* * * * *